(12) United States Patent
Morejon et al.

(10) Patent No.: US 8,508,126 B1
(45) Date of Patent: Aug. 13, 2013

(54) HIGH EFFICIENCY SOLID STATE DIRECTIONAL LIGHTING INCLUDING LUMINESCENT NANOCRYSTAL PARTICLES

(75) Inventors: Israel J. Morejon, Tampa, FL (US); Jinhui Zhai, Oldsmar, FL (US)

(73) Assignee: Lednovation, Inc., Tampa, FL (US)

( * ) Notice: Subject to any disclaimer, the term of this patent is extended or adjusted under 35 U.S.C. 154(b) by 190 days.

(21) Appl. No.: 13/220,175

(22) Filed: Aug. 29, 2011

(51) Int. Cl.
*H05B 33/00* (2006.01)

(52) U.S. Cl.
USPC ............ 313/506; 313/504; 313/46; 362/294; 362/373; 362/800

(58) Field of Classification Search
None
See application file for complete search history.

(56) References Cited

U.S. PATENT DOCUMENTS

| 8,162,498 | B2 * | 4/2012 | Ramer et al. | 362/84 |
| 2009/0224277 | A1 * | 9/2009 | Leung et al. | 257/98 |
| 2009/0274188 | A1 * | 11/2009 | Jang et al. | 372/50.1 |
| 2011/0317397 | A1 * | 12/2011 | Trottier et al. | 362/84 |

* cited by examiner

*Primary Examiner* — Ashok Patel
(74) *Attorney, Agent, or Firm* — Ronald E. Smith; Smith & Hopen, P.A.

(57) ABSTRACT

A solid state directional lighting device includes a semiconductor light source emitting a primary short wavelength light and a light collimation component disposed in light-reflecting relation to the light source to generate a collimated light with beam divergence angle less than forty degrees (40°). A luminescent nanocrystal conversion layer is disposed in the path of the collimated light and includes a luminescent nanocrystal conversion layer including luminescent nanocrystal particles with nano-particles sizes less than fifteen nanometers (15 nm). The luminescent nanocrystal particles absorb at least a portion of the collimated short wavelength light and convert the absorbed light into at least one long wavelength spectral light. A mixture of leakage primary short wavelength light and long wavelength light converted by the luminescent nano-particles produces a directional white light with luminous efficacy of at least one hundred lumens per Watt (100 lm/W). Light scattering is reduced due to the nano-particle size.

20 Claims, 4 Drawing Sheets

HIGH EFFICIENCY SOLID STATE DIRECTIONAL LIGHTING INCLUDING LUMINESCENT NANOCRYSTAL PARTICLES

BACKGROUND OF THE INVENTION

1. Field of the Invention

This invention relates to solid state lighting devices. More particularly, it relates to solid state directional lighting devices having high luminous efficacy with high color rendering index.

2. Brief Description of the Related Art

It is well known that directional halogen lamps, like PAR lamps and MR lamps, or conventional ceiling spot lights, are very energy inefficient light sources; about 85-90% of the electricity they consume is released as heat rather than light. Accordingly, efforts have been ongoing to develop solid state directional warm white lighting devices to replace these inefficient warm white halogen lamps and spot lights in a wide variety of applications. Moreover, where solid state lighting devices are already being used, efforts are ongoing to provide improvement with respect to energy efficiency, color rendering index, luminous efficacy (lm/W), color temperature, and duration of service, especially for indoor applications.

Conventional solid state directional lighting devices usually utilize phosphor converted semiconductor warm white light emitting diodes (LEDs) in order to replace traditional directional halogen lighting devices which provide warm white color with correlated color temperature (CCT) of 2700K and 3000K. The phosphor converted warm white LED utilizes a blue LED with peak wavelength of 440 nm~470 nm and a luminescent conversion layer directly deposited on top of an LED die containing a mixture of micro-particles phosphors, to produce a warm white light from the mixture of primary blue spectral light and excited green or yellow light with peak wavelength of 545 nm~575 nm and excited reddish light with peak wavelength of 610 nm~630 nm. However, conventional phosphor converted warm white LEDs have inadequate luminous efficacy due to multi-phosphors self-absorption loss, back-scattering loss of micro-particles and less human eye sensitivity of deep red light due to wide spectral width (full width of half maximum, FWHM) of reddish excitation light. They also exhibit phosphor degradation due to high LED case temperature. They also have a relatively low color rendering index. Conventional solid state directional lighting devices usually have color rendering indices (CRI/Ra) of only around 80, compared to CRI of 100 from incandescent light bulbs and halogen lamps. Further improvement of CRI to above 85, even above 90 is possible, but involves a deep red excitation light which in trade-off has 15-25% further loss of luminous efficacy.

Recently, efforts are ongoing to develop remote phosphor solutions which position conventional luminescent conversion phosphors in spaced relation away from direct contact with a semiconductor LED die to reduce phosphor degradation associated with elevated temperatures and to inhibit light loss resulting from back-scattering into the LED die. This conventional remote phosphor solution does not overcome the excessive light scattering problem due to its micro-particles size when used in directional lighting devices.

Thus there is a need for improved solid state directional lighting devices having high luminous efficacy without substantial phosphor degradation. There is a need as well for such devices having higher color rendering indices with less light scattering.

However, in view of the art considered as a whole at the time the present invention was made, it was not obvious to those of ordinary skill in the field of this invention how the shortcomings of the prior art could be overcome to provide a solid state directional lighting device having improved luminous efficacy, reduced phosphor degradation, increased color rendering index, and reduced light scattering.

BRIEF SUMMARY OF THE INVENTION

The long-standing but heretofore unfulfilled need for an improved solid state directional lighting device is now met by a new, useful, and nonobvious invention.

The novel solid state directional lighting device includes a semiconductor light source emitting a primary short wavelength light. The device further includes a light collimation component disposed in light-reflecting relation to said semiconductor light source. The light collimation component generates a collimated light with beam divergence angle less than forty degrees (40°) measured at full width at half maximum (FWHM) intensity.

A luminescent nanocrystal conversion layer is disposed in the path of the collimated light. The conversion layer includes luminescent nanocrystal particles having nano-particles that do not exceed 15 nm in size. The luminescent nanocrystal particles absorb at least a portion of the collimated short wavelength light and convert said portion into at least one long wavelength spectral light. A mixture of leakage primary short wavelength light and long wavelength light converted by said luminescent nano-particles produces a directional white light having a luminous efficacy of at least one hundred lumens per Watt (100 lm/W) with a high color rendering index.

The nano-particle size is sufficiently small to avoid divergence or scattering of the light waves, thereby overcoming the prior art problem of excessive light scattering caused by luminescent particles having sizes measured in microns.

The novel structure also spaces the nano-particles sufficiently apart from the semiconductor light source to reduce heat transfer from said light source to said particles, thereby overcoming the prior art problem associated with heat-induced phosphor degradation.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
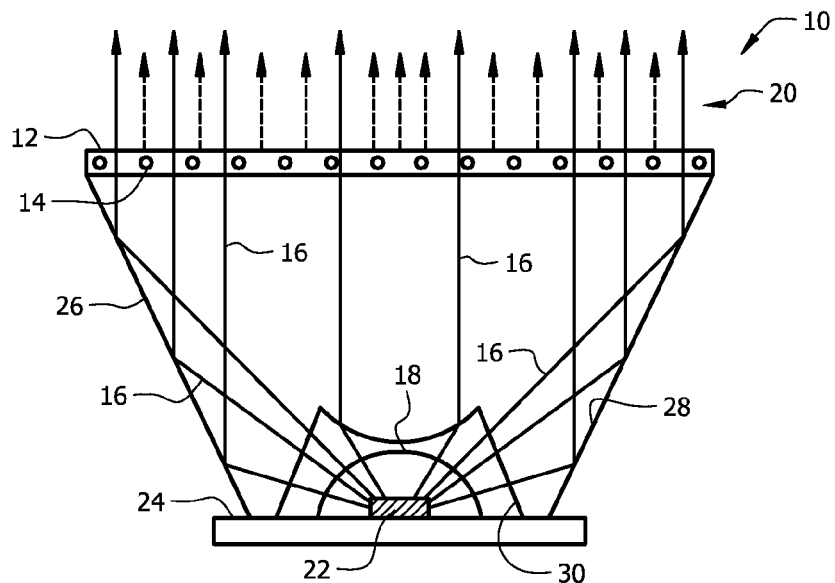
FIG. 1 is a schematic side elevational view of a first embodiment of the invention.

A first embodiment of the novel lighting device is denoted as a whole in FIG. 1 by the reference numeral 10.

Novel solid state directional lighting device 10 has a color conversion layer 12 including luminescent nanocrystal particles 14. At least a portion of collimated primary short wavelength light 16 from semiconductor light source 18 is converted into at least one long wavelength spectral light 20.

Semiconductor light source 18 includes at least one short wavelength semiconductor light emitting diode (LED) 22 mounted on printed circuit board 24. LED 22 emits a primary short wavelength light with peak wavelength of 380 nm-475 nm. Light from semiconductor light source 18 is reflected from frusto-conical sidewalls mounted about the periphery of said printed circuit board, said sidewalls forming a collimation lens 26 having a total internal reflection surface 28. Semiconductor light source 18 is positioned in cavity 30 as an entrance of said collimation lens.

Collimated light thus follows a path of travel that intersects with color conversion layer 12.

The color conversion from nanocrystal particles 14 causes much less light scattering than conventional micro-particles phosphor conversion due to said nano-particles having a size of less than fifteen nanometers (15 nm). This size, unlike the micron-scale luminescent particles of the prior art, maintains the tight collimated light after color conversion. The mixture of leakage primary short wavelength collimated light 16 and luminescent converted long wavelength collimated light produces a solid state directional white light 20 with luminous efficacy of at least one hundred lumens per Watt (100 lm/W).

Collimation lens 26 may be a glass lens or an optical plastic lens molded from optical transparency resin, such as acrylic or polycarbonate material, providing a total internal reflection (TIR) surface to collimate the wide divergence light from semiconductor light source 18 into a collimated light with beam angle less than forty degrees (40°) measured at full width at half maximum (FWHM) intensity. The output surface of the collimation lens may be flat, concave, convex or it may have honeycomb features formed in its lens output surface.

Luminescent nanocrystal layer 12 is deposited on the output surface of collimation lens 26 by a process of spraying, coating and sputtering. Layer 12 is spaced apart from LED 22 to reduce heat transfer from LED 22 to luminescent nanocrystal layer 12. Luminescent nanocrystal layer 12 includes at least one type of luminescent nano-particles to absorb the primary short wavelength light and to convert it into a long wavelength light having a spectral bandwidth less than fifty nanometers (50 nm) FWHM. The mixture of collimated short wavelength light 16 from semiconductor light source 18 and the excited longer wavelength light produces collimated white light 20 having correlated color temperature of 2700K-6000K.

Luminescent nanocrystal layer 12 may have a variable concentration of nano-particles 14 to uniformly convert the short wavelength light 16 from semiconductor light source 18 into color uniform white light 20. Luminescent nano-particles 14 have a particle size less than fifteen nanometers (15 nm), which is much smaller than the micron-sized wavelength of primary short wavelength light 16 and excited long wavelength light 20, so the light scattering from said nano-particles 14 is significantly reduced, which substantially maintains the tight collimated light after color conversion.

Luminescent nano-particles 14 may be a core-shell CdSe/ZnS quantum dots or indium phosphide quantum dots. Luminescent nanocrystal layer 12 may include at least two nano-particle layers or a mixture of two nano-particles material to absorb primary short wavelength light 16 and to convert at least some of said light into a yellow spectral light with peak wavelength of 545 nm-575 nm and some of said light into a reddish spectral light with peak wavelength of 610-630 nm having a spectral bandwidth less than fifty nanometers (50 nm) FWHM. The mixture of primary short wavelength collimated light 16 and excited yellow and reddish spectral light produces a collimated warm white light 20 having correlated color temperature of 2700K-3500K and a color rendering index of at least eighty five (85).

Figure 2:
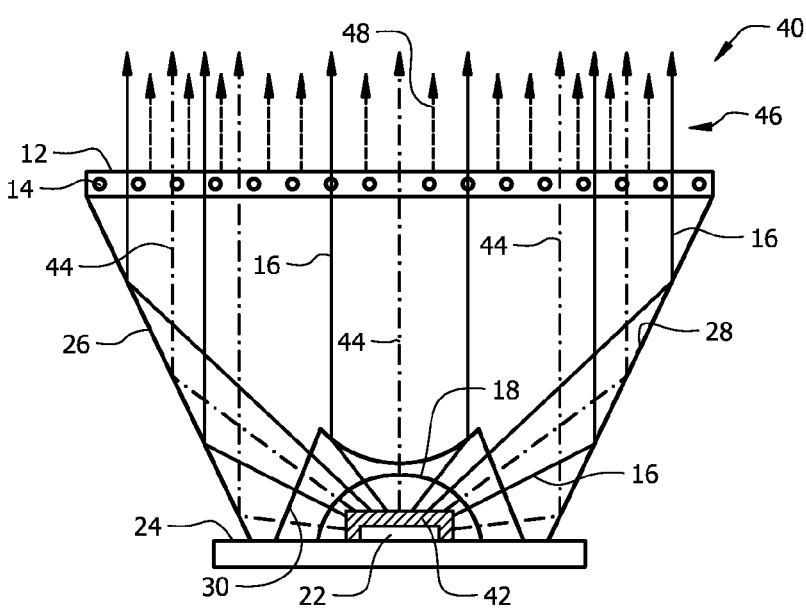
FIG. 2 is a schematic side elevational view of a second embodiment thereof.

FIG. 2 depicts a second embodiment denoted 40 as a whole. Solid state directional lighting module 40 includes collimation lens 26, semiconductor white light source 18 disposed at the entrance of the collimation lens, and luminescent nanocrystal layer 12 disposed at the output aperture of the collimation lens as in the first embodiment.

Semiconductor white light source 18 includes at least one short wavelength LED 22 with peak wavelength of 380 nm-475 nm, and at least one wavelength conversion phosphor layer 42 deposited on top of short wavelength LED die 22 to convert a portion of the primary short wavelength light 16 into a secondary yellow light 44 with peak wavelength of 545 nm-575 nm. The combination of the leakage primary short wavelength light 16 and the excited secondary yellow wavelength light 44 produces a cool white light 46 with correlated color temperature of 4500K-8000K.

Luminescent nanocrystal layer 12 disposed at the output aperture of the collimation lens 26 absorbs a portion of leakage primary short wavelength light 16 and converts it into a third reddish orange spectral light 48 with peak wavelength of 610 nm-630 nm and spectral bandwidth less than fifty (50) nm FWHM. The mixture of collimated cool white 46 and the converted reddish orange spectral light 48 produces a warm white directional light having correlated color temperature of 2700K-3500K and a color rendering index of at least eighty five (85).

Figure 3:
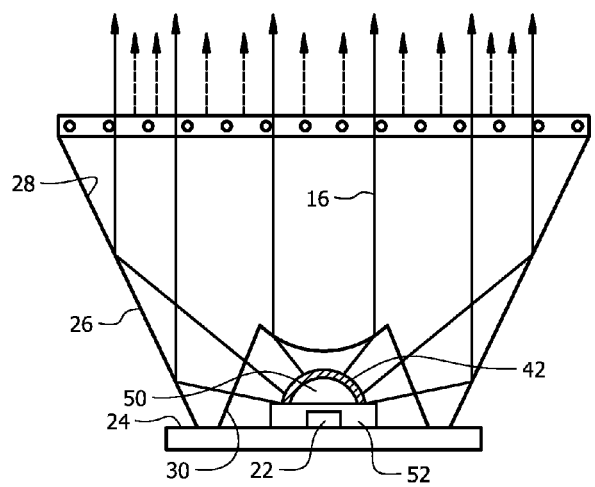
FIG. 3 is a schematic side elevational view of a third embodiment thereof.

As depicted in the embodiment of FIG. 3, wavelength conversion phosphor layer 42 may be deposited on primary lens 50 of LED 22 to space wavelength conversion phosphor layer 42 away from the semiconductor die for less performance degradation over temperature. Reference numeral 52 in this embodiment denotes the semiconductor cool white light source. Wavelength conversion phosphor layer 42 may be a luminescent nanocrystal layer that includes luminescent conversion nano-particles to absorb at least a portion of primary short wavelength light and to convert it into at least one secondary yellow light with less light loss from back-scattering into LED 22.

Figure 4:
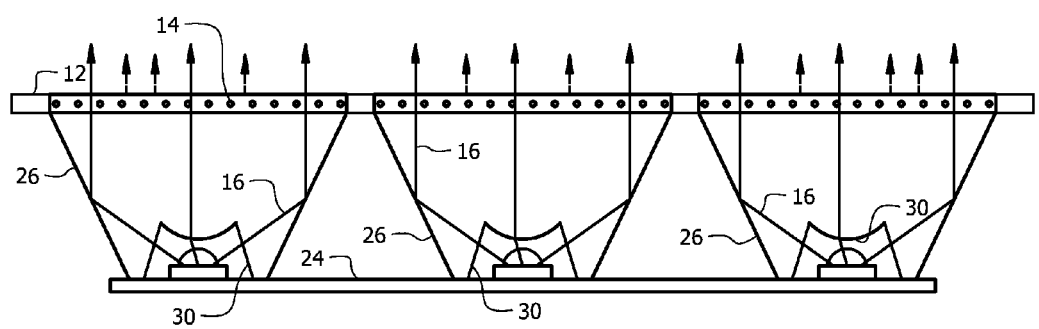
FIG. 4 is a schematic side elevational view of a fourth embodiment thereof.

As depicted in FIG. 4, a plurality of collimation lenses 26 may form an array of lenses with each lens disposed on top of each light emitting component. The output surface of each collimation lens may be flat, concave, convex or have honeycomb features formed in its lens output surface. The array may be formed by a plurality of the lighting devices of the first embodiment (FIG. 1), the second embodiment (FIG. 2), or the third embodiment (FIG. 3).

Figure 5:
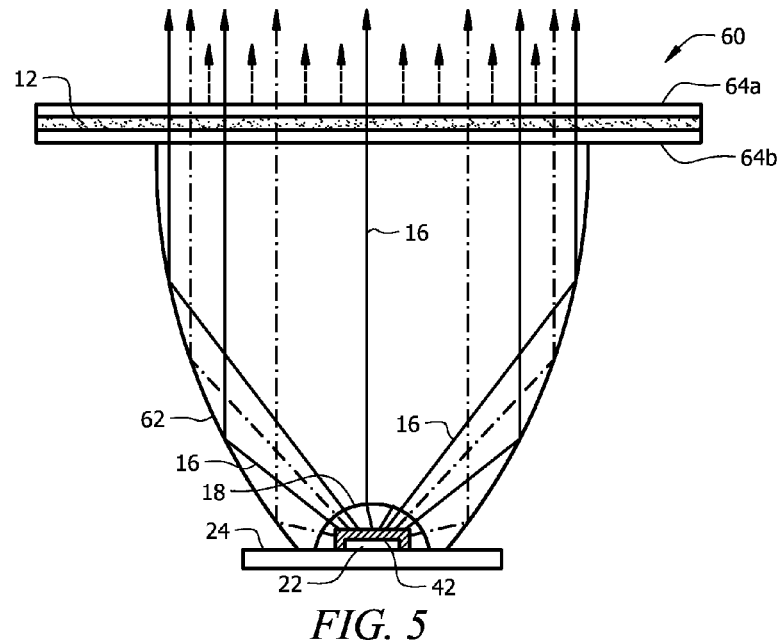
FIG. 5 is a schematic side elevational view of a fifth embodiment thereof.

FIG. 5 depicts solid state directional lighting module 60 that includes semiconductor light source 18 that emits a cool white light with correlated color temperature of 4500 k-8000K. Parabolic reflector 62 receives cool white light 16 from semiconductor light source 18 and converts it into a collimated light with beam divergence angle less than forty degrees (40°) FWHM. Luminescent nanocrystal conversion component 12 is disposed at the output of parabolic reflector 62 to convert the cool white light into a warm white light with correlated color temperature of 2700K-3500K. As an alternative, parabolic reflector 62 may be any shape reflector with high reflection coating at reflectance over 90%.

Semiconductor light source 18 may include a single LED 22 or high power chip on board (COB) LED. Parabolic reflector 62 is a single reflector.

As depicted in FIG. 5, luminescent nanocrystal conversion component 12 may be a single luminescent nano-particles layer sandwiched between two sheets of glass 64a, 64b or two optical plastic substrates.

Alternatively, a single sheet of glass may be provided and the luminescent nanocrystal conversion component 12 may have a luminescent nano-particles layer deposited on one side of said sheet of glass or optical plastic substrate.

Figure 6:
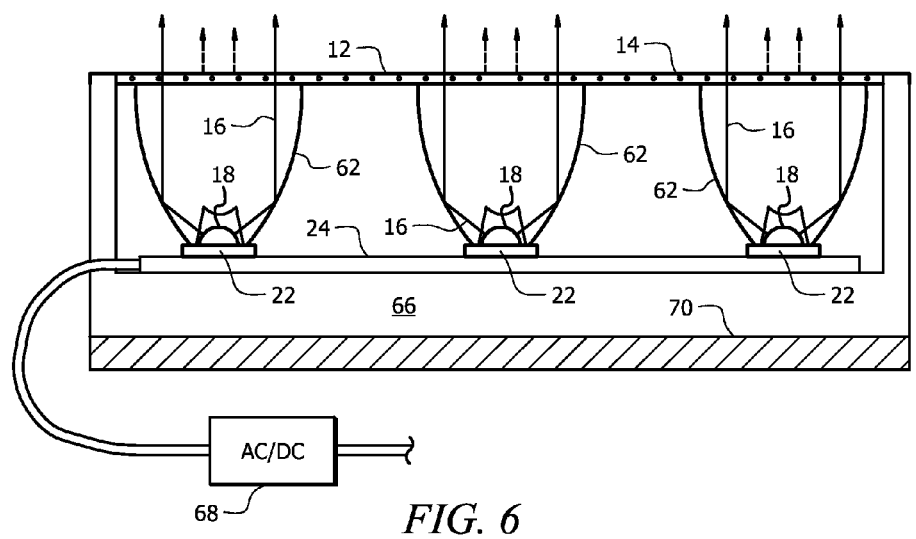
FIG. 6 is a schematic side elevational view of a sixth embodiment thereof.

As depicted in FIG. 6, the semiconductor light source may include an array of light emitting diodes 22 and a corresponding array of parabolic reflectors 62. The semiconductor light sources emit a mixture of primary short wavelength light and excited secondary yellow light.

As in all of the other embodiments, luminescent nanocrystal layer 12 may have variable concentrations of nano-particles to uniformly convert the collimated cool white light from semiconductor light source 18 into a desired color uniform warm white. Luminescent nanocrystal layer 12 includes luminescent nano-particles 14 to absorb the leakage primary short wavelength light and convert it into a third spectral light having spectral bandwidth less than fifty nanometers (50 nm) FWHM and with peak wavelength longer than the peak wavelength of the primary spectral light and the secondary spectral light.

Luminescent nano-particles 14 have a particle size less than fifteen nanometers (15 nm), which is much smaller than the micron-sized wavelength of the primary light, so the light scattering from the nano-particles is significantly reduced. This substantially maintains the tight collimated light from the collimation lens.

As in the other embodiments, the luminescent nano-particles may be a core-shell CdSe/ZnS quantum dots or indium phosphide quantum dots. The luminescent nanocrystal component may be used as a cover of the solid state directional lighting module, which is substantially used as a color temperature tuning component during manufacturing process or applications. The surface of the substrate of luminescent nanocrystal component 12 may have anti-reflection (AR) coating to reduce Fresnel reflection loss.

The embodiment of FIG. 6 depicts a solid state light engine that may be formed using the light modules of FIGS. 1-3 as arrayed in FIG. 4 or the light module of FIG. 5 as arrayed in FIG. 4, which includes at least one semiconductor light component 18 disposed on thermal conductive substrate 24 to emit a cool white light with correlated color temperature of 4500 k-8000K. Heat dissipation base 66 is attached to thermal conductive substrate 24 to conduct heat away from semiconductor light source 18 and dissipate into the ambient. An electrical AC-to-DC conversion component 68 is connected to semiconductor light source 18 to activate said semiconductor light source. The solid state light engine may have a thermal interface 70 to a lighting fixture such as a lamp, or a luminaire when integrated into a lighting fixture in variety of applications.

Figure 7:
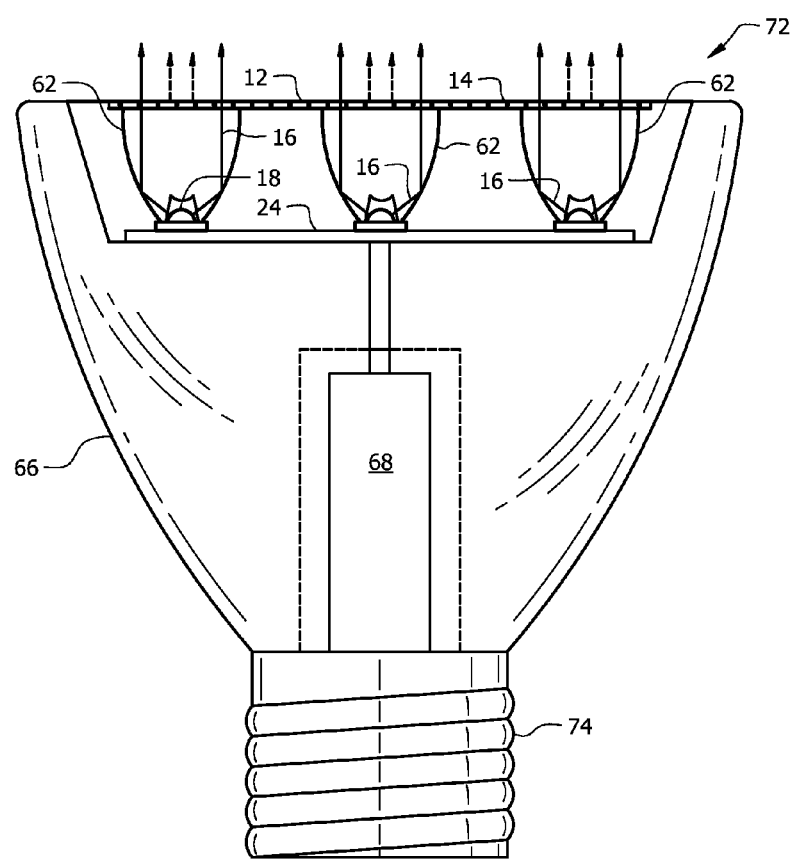
FIG. 7 is a schematic side elevational view of a seventh embodiment thereof.

FIG. 7 depicts an LED lamp 72 of the type that may be formed using the light modules of FIGS. 1-3 as arrayed in FIG. 4 or the light module of FIG. 5 as arrayed in FIGS. 4 and 6. Heat dissipation base 66 may have a base connector 74 for electrical interface to a standard socket, for example an Edison-type E26 or E27 screw socket. Heat dissipation base 66, electrical AC-to-DC conversion component 68, base connector socket 74, semiconductor light source 18 and luminescent nanocrystal layer 12 collectively form LED lamp 72 having the size and shape of standard PAR lamps such as PAR38, PAR30, PAR20, or standard MR16 and GU10 lamps. The LED lamps produce a warm white directional light with a CCT of 2700K-3500K, a beam divergence angle less than forty degrees (40°), a color rendering index of at least 85 and luminaire efficacy of at least of 70 lm/W.

Electrical AC-to-DC conversion component 68 may be enclosed in heat dissipation base 66 inside lighting fixture 72 or it may be a separate module as depicted in FIG. 6. Light rays 16 in FIGS. 6 and 7 are represented by only two (2) rays per light module to avoid cluttering the drawings.

The objects set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

What is claimed is:

1. A solid state directional lighting device, comprising:
a semiconductor light source emitting a primary short wavelength light;
a light collimation lens disposed in light-reflecting relation to said semiconductor light source to generate a collimated light that follows a path of travel;
a luminescent nanocrystal conversion layer disposed in intersecting relation to said collimated light path of travel;
said luminescent nanocrystal conversion layer including luminescent nanocrystal particles with nano-particle sizes less than 15 nm;
a light engine including said semiconductor light source;
a thermally conductive substrate;
said semiconductor light source being mounted on said thermally conductive substrate;
said light engine including said light collimation lens disposed in light-reflecting relation to said semiconductor light source to generate a collimated light that follows a path of travel;
said light engine including said luminescent nanocrystal conversion layer disposed in intersecting relation to said collimated light path of travel;
a heat dissipation base attached to said thermally conductive substrate to conduct heat away from said semiconductor light source and dissipate said heat into an ambient environment.

2. The device of claim 1, further comprising:
said collimated light having a beam divergence angle less than 40 degree measured at full width at half maximum (FWHM) intensity.

3. The device of claim 2, further comprising:
said luminescent nanocrystal particles absorbing at least a portion of collimated short wavelength light and converting said portion of collimated short wavelength light into at least one long wavelength spectral light; and
a mixture of leakage primary short wavelength light and long wavelength light converted by said luminescent nano-particles producing a directional white light with luminous efficacy of at least one hundred lumens per Watt (100 lm/W);
whereby light scattering is reduced due to said nano-particle size.

4. The device of claim 1, further comprising:
said light collimation lens having a frusto-conical configuration with a total internal reflection surface.

5. The device of claim 4, further comprising:
said light collimation lens being formed of glass.

6. The device of claim 4, further comprising:
said light collimation lens being formed of an optical plastic molded from an optical transparency resin.

7. The device of claim 1, further comprising:
said light collimation lens having a parabolic reflector configuration.

8. The device of claim 1, further comprising:
a plurality of said light collimation lenses forming an array of lenses with each lens disposed on top of each semiconductor light source.

9. The device of claim 1, further comprising:
said luminescent nanocrystal-particles being a core-shell CdSe/ZnS quantum dots.

10. The device of claim 1, further comprising:
said luminescent nanocrystal particles being indium phosphide quantum dots.

11. The device of claim 1, further comprising:
said semiconductor light source including at least one short wavelength LED die with peak wavelength of 380 nm-475 nm;
said luminescent nanocrystal particles absorbing at least a portion of collimated short wavelength light and converting said portion of collimated short wavelength light into at least a yellow spectral light with peak wavelength of 545 nm-575 nm and a reddish spectral light with peak wavelength of 610 nm-630 nm; and
a mixture of leakage primary short wavelength light and the yellow and reddish spectral light converted by said luminescent nano-particles producing a directional warm white light having correlated color temperature of 2700 k-3500 k and a color rendering index of at least 85.

12. The device of claim 1, further comprising:
said semiconductor light source including at least one short wavelength LED die with peak wavelength of 380 nm-475 nm;
at least one wavelength conversion phosphor layer deposited on top of said short wavelength LED die to convert a portion of primary short wavelength light into a secondary yellow light with peak wavelength of 545 nm-575 nm;
whereby combination of leakage primary short wavelength light and the secondary yellow wavelength light produces a cool white light with correlated color temperature of 4500K-8000K.

13. The device of claim 1, further comprising:
said semiconductor light source including at least one short wavelength LED die with peak wavelength of 380 nm-475 nm;
a primary lens disposed over said semiconductor light source;
at least one wavelength conversion phosphor layer deposited on said primary lens to space said wavelength conversion phosphor layer away from the LED die, said spacing reducing heat transfer from said LED die to said phosphor layer and therefore reducing temperature-based performance degradation;
said wavelength conversion phosphor layer converting a portion of primary short wavelength light into a secondary yellow light with peak wavelength of 545 nm-575 nm;
whereby combination of leakage primary short wavelength light and the secondary yellow wavelength light produces a cool white light with correlated color temperature of 4500K-8000K.

14. The device of claim 13, further comprising:
said luminescent nanocrystal particles absorbing at least a portion of primary short wavelength light and converting said portion of primary short wavelength light into a reddish spectral light with peak wavelength of 610 nm-630 nm; and
a mixture of said collimated cool white from said semiconductor light source and said reddish spectral light converted by said luminescent nano-particles producing a directional warm white light having correlated color temperature of 2700 k-3500 k and a color rendering index of at least 85.

15. The device of claim 1, further comprising:
an electrical AC-to-DC conversion component connected in electrical communication with said semiconductor light source to provide power to said semiconductor light source.

16. The device of claim 15, further comprising:
a lighting fixture;
a thermal interface disposed between said light engine and said lighting fixture.

17. The device of claim 15, further comprising:
a standard Edison-type base connector socket;
said LED light engine, said heat dissipation base, said base connector socket and said electrical AC-to-DC conversion component collectively forming an LED directional lamp having a shape substantially equal to the shape of a standard conventional directional light lamp.

18. The device of claim 17, further comprising:
said LED directional lamp having a shape substantially equal to the shape of a standard conventional PAR lamp.

19. The device of claim 17, further comprising:
said LED directional lamp having a shape substantially equal to the shape of a standard conventional MR lamp or GU10 lamp.

20. The device of claim 17, further comprising:
an LED directional lamp having a beam divergence angle less than forty degreed (40°);
a correlated color temperature of 2700K~3500K;
a color rendering index of at least 85; and
a luminaire efficacy of at least of 70 lm/W.

* * * * *